(12) United States Patent
Jacquemod et al.

(10) Patent No.: US 10,164,573 B2
(45) Date of Patent: Dec. 25, 2018

(54) METHOD AND DEVICE FOR AUTO-CALIBRATION OF MULTI-GATE CIRCUITS

(71) Applicants: UNIVERSITE DE NICE, Nice (FR); COMMISSARIAT A L'ENERGIE ATOMIQUE ET AUX ENERGIES ALTERNATIVES, Paris (FR)

(72) Inventors: Gilles Fernand Jacquemod, Antibes (FR); Emeric De Foucauld, Coublevie (FR); Alexandre Benjamin Fonseca, Seillans (FR); Yves Leduc, Roquefort-les-Pins (FR); Philippe Bernard Pierre Lorenzini, Antibes (FR)

(73) Assignees: UNIVERSITE DE NICE, Nice (FR); COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 138 days.

(21) Appl. No.: 15/094,163

(22) Filed: Apr. 8, 2016

(65) Prior Publication Data
US 2016/0301365 A1 Oct. 13, 2016

(30) Foreign Application Priority Data
Apr. 10, 2015 (FR) ..................................... 15 53096

(51) Int. Cl.
*H03B 27/00* (2006.01)
*H03K 17/16* (2006.01)
(Continued)

(52) U.S. Cl.
CPC .......... *H03B 27/00* (2013.01); *H01L 29/785* (2013.01); *H01L 29/7831* (2013.01);
(Continued)

(58) Field of Classification Search
CPC ........ H03K 19/00; H03K 5/134; H03K 17/16; H03K 19/0027; H03K 19/0013;
(Continued)

(56) References Cited

U.S. PATENT DOCUMENTS 6,313,691 B1 * 11/2001 Podlesny ............. H03K 17/145
327/534
6,833,749 B2 * 12/2004 Erstad ................... H03K 3/3565
327/206
(Continued)

FOREIGN PATENT DOCUMENTS

EP 1 744 364 A2 1/2007
WO 2012/045874 A1 4/2012

*Primary Examiner* — Arnold Kinkead
(74) *Attorney, Agent, or Firm* — Baker & Hostetler LLP

(57) ABSTRACT

A differential-logic logic circuit chained with another differential-logic circuit comprises a first logic cell composed of back-gate transistors, the first cell having a first input for receiving a first input signal and having an output for delivering a first output signal, and a second logic cell complementary to the first cell, composed of back-gate transistors, the second cell having as many inputs as the first cell, each input able to receive an input signal complementary to the respective input signal of the first cell, the second cell having an output for delivering a second output signal complementary to the first output signal of the first cell. The first output signal of the first cell is applied to the back gate of each transistor of the second cell, and the second output signal of the second cell is applied to the back gate of each transistor of the first cell.

17 Claims, 6 Drawing Sheets

(51) Int. Cl.
*H03K 19/00* (2006.01)
*H03K 19/017* (2006.01)
*H03K 19/0948* (2006.01)
*H01L 29/78* (2006.01)
*H03K 3/03* (2006.01)
*H03K 19/0944* (2006.01)

(52) U.S. Cl.
CPC ........... *H03K 3/0322* (2013.01); *H03K 17/16* (2013.01); *H03K 19/0013* (2013.01); *H03K 19/0027* (2013.01); *H03K 19/01707* (2013.01); *H03K 19/0944* (2013.01); *H03K 19/0948* (2013.01)

(58) Field of Classification Search
CPC ... H03B 27/00; H01L 29/7831; H01L 29/785; G11C 7/22
USPC .... 327/280, 534, 206, 354; 326/32, 104, 21, 326/121, 113, 101; 331/57; 365/203
See application file for complete search history.

(56) References Cited

U.S. PATENT DOCUMENTS

| | | | | |
|---|---|---|---|---|
| 2007/0262793 | A1* | 11/2007 | Kapoor | H01L 29/8086 326/101 |
| 2012/0275254 | A1* | 11/2012 | Ferrant | G11C 7/065 365/203 |
| 2015/0263707 | A1* | 9/2015 | Kumar | H03K 3/3565 327/205 |

* cited by examiner

METHOD AND DEVICE FOR AUTO-CALIBRATION OF MULTI-GATE CIRCUITS

CROSS-REFERENCE TO RELATED APPLICATIONS

This application claims priority to foreign French patent application No. FR 1553096, filed on Apr. 10, 2015, the disclosures of which are incorporated by reference in their entirety.

FIELD OF THE INVENTION

The invention lies in the field of integrated circuits, and in particular that of multi-gate circuits of FinFET or FDSOI type.

BACKGROUND

Every year, new microelectronic technologies are available, affording innovations and improvements to our daily life. All this is possible by virtue of circuits of ever higher performance and ever more complex functions. This increase in performance has been made possible through the miniaturization of elementary components, namely transistors. Current technologies make it possible to design microchips having transistors with atomic dimensions. As the size of the transistors is reduced towards some ten nanometers, the variation of the dopants in the region of the channel directly causes a variation of the threshold voltage $V_{TH}$ between two transistors assumed to be identical and adjacent on one and the same microchip. Novel structures of MOSFET transistors have recently been proposed so as to reduce the variability of the components below 22 nm, some according to FinFet technology which uses multi-gate non-planar transistors, and others according to FDSOI "Fully Depleted Silicon On Insulator" technology.

FDSOI (Fully Depleted Silicon on Insulator) technology is based on a thin (5 to 20 nm) layer of silicon on a thin (5 to 50 nm) buried oxide (Buried Oxide—BOx) layer. The transistors are constructed on the fine non-doped silicon layer (depleted of charge) which has several advantages with respect to the Bulk. As the channel is completely depleted, the random variation of the dopants which impinged on the Bulk CMOS is reduced, thereby improving the performance at lower VDD. FDSOI claims an improvement in the Consumption/Performance ratio of the order of 30 to 40% versus 20 nm Bulk CMOS.

However, the variability of the fabrication methods remains constraining for integrated circuits and it introduces mismatches of the transistors. Thus on one and the same microchip, transistors assumed to be identical will not have the same characteristics. This difference in characteristics may introduce malfunctions of the final circuit, which may then no longer satisfy, for certain applications, the specifications demanded.

In the specific case of analogue electronics, certain cells require the transistors to be identical, that is to say matched. Techniques for calibrating circuits have become necessary for a majority of applications.

However, the known approaches for the implementation of calibration lead to an increase in the surface area of the final circuit through extra electronics, therefore to an increase in consumption and to an increase in overall cost.

Hence a problem to be solved is that of proposing a calibration solution for circuits which does not increase the surface area of the circuit, and which exhibits an immunity to the variability of the methods.

FDSOI technology which does not need any doping to control the threshold voltage, and which moreover offers on the transistors a back gate, makes it possible to propose a calibration solution based on the control of the back gate of the transistors.

However, in the case of differential analogue circuits, such as current mirrors or differential pairs, it is important that the transistors have the same characteristics. Likewise, to produce oscillators, especially ring oscillators based on inverters, it is also important that the transistors (therefore the inverters) have the same characteristics so as to decrease the phenomenon of jitter. However, no known simple solution to this problem exists in FDSOI technology.

Therefore the need exists for a solution which alleviates the drawbacks of the known approaches. The present invention addresses this need. This invention applies to all digital circuits using complementary logic.

SUMMARY OF THE INVENTION

An object of the present invention is to propose a complementary-logic circuit according to claim 1. In particular, a differential-logic circuit able to be chained with another differential-logic circuit comprises: a first logic cell composed of back-gate transistors, the first cell having at least one first input for receiving at least one first input signal and having an output for delivering a first output signal; and a second logic cell complementary to the first cell, composed of back-gate transistors, the second cell having as many inputs as the first cell, each input being able to receive an input signal complementary to the respective input signal of the first cell, the second cell having an output for delivering a second output signal complementary to the first output signal of the first cell. The circuit is characterized in that the said first output signal of the first cell is applied to the back gate of each transistor of the second cell, and in that the said second output signal of the second cell is applied to the back gate of each transistor of the first cell.

Various embodiments appear in the description and the dependent claims.

DESCRIPTION OF THE FIGURES

Various aspects and advantages of the invention will become apparent in support of the description of a preferred but nonlimiting mode of implementation of the invention, with reference to the figures hereinbelow.

DETAILED DESCRIPTION OF THE INVENTION

Figure 1:
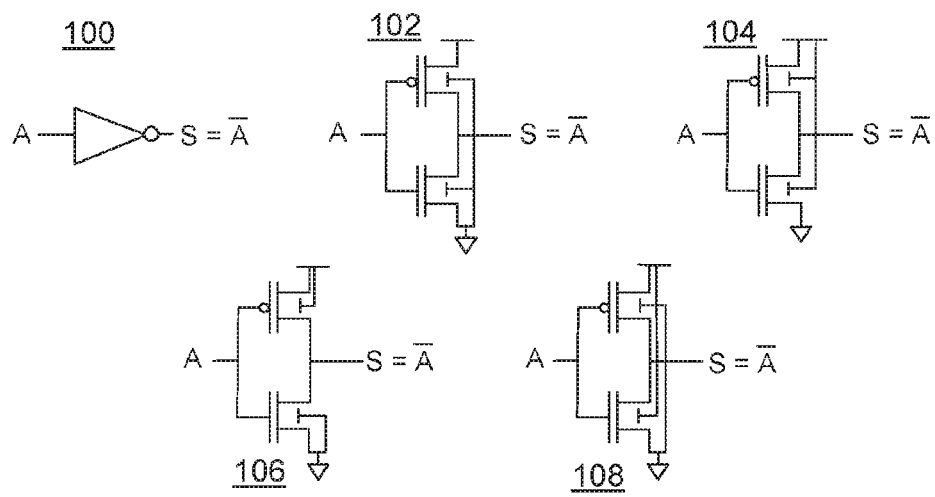
FIG. 1 is a representation in conventional logic of an inverter and of its production, using the various possible biasings of the back gate of its 2 component transistors.

Reference is made to FIG. 1 where a logic conventional representation 100 of an inverter circuit having an input 'I=A' and delivering a complementary output 'S=$\overline{A}$' is shown. A few examples of implementations of such an inverter in a back-gate transistors technology such as FDSOI CMOS technology are illustrated, where the back gates of the transistors can be connected to like voltages (102, 104) or to different voltages (106, 108). However, these examples are nonlimiting and the principles of the invention can apply to other technologies proposing dissymmetric transistors having asymmetric gates.

Figure 2:
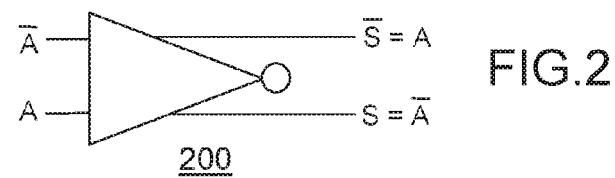
FIG. 2 is a representation in complementary logic of an inverter cell according to an embodiment of the invention.

FIG. 2 illustrates, on a representation of an inverter circuit, the general principle of the invention which is to symmetrize the operation of the circuit according to complementary logic. The inverter circuit 200 of the invention comprises a complementary input and a complementary output. The input of the circuit receives a first signal 'A' and a second signal '$\overline{A}$' complementary to the first signal. The complementary output delivers a first signal 'S=$\overline{A}$' inverse to the first input signal 'A', and a second complementary signal 'S=A', inverse to the second input signal. The transistors of the circuit are of a type having a back gate, in SOI, FDSOI, or else CMOS technology with bulk, double-well or triple-well. The transistors can also be of dual-gate type in FinFet technology, or any other technology offering on a transistor a gate making it possible to control the threshold voltage of the transistor. According to the principle of the invention, the characteristics of the transistors are modified as a function of the characteristics of the output of the circuit by modifying the value on the back gate or the dual-gate of the transistors. The output signal is a complementary signal symmetrized by virtue of a control of the threshold voltages of the transistors.

Figure 3:
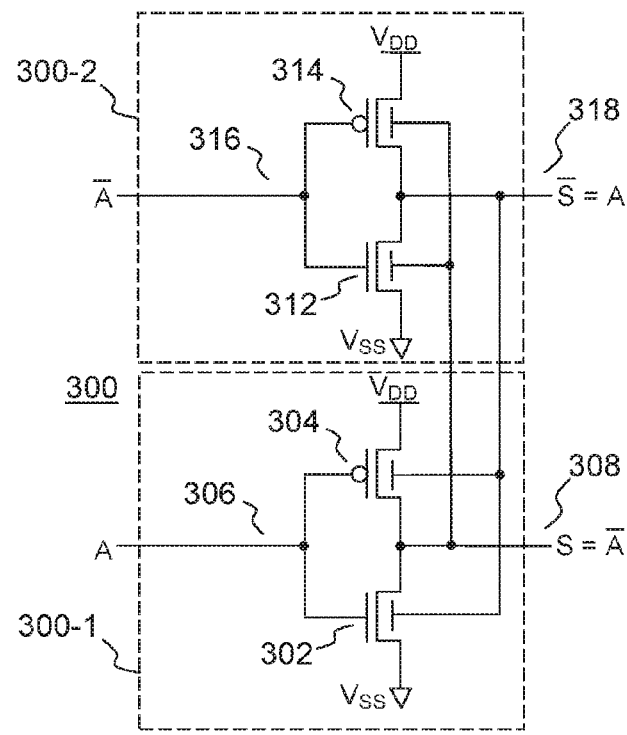
FIG. 3 shows a preferential implementation of the inverter cell of FIG. 2 according to an embodiment.

FIG. 3 shows an exemplary implementation of the inverter circuit of FIG. 2 in FDSOI CMOS technology. In a general manner, the circuit 300 comprises a first cell 300-1 for receiving on a first input a first input signal 'A' and delivering on a first output, a first output signal 'S'. It comprises a second cell 300-2 in complementary logic for receiving on a second input a second input signal '$\overline{A}$' complementary to the first input signal, and delivering on a second output, a second output signal 'S' which is complementary to the first output signal of the first cell. The transistors of the first and second cells having back gates, the novel and inventive principle of the present invention consists in that the output of each cell is looped back to the back gate of all the transistors carrying out the logic function of the other cell. Thus, the output of the first cell is applied to the back gates of the transistors of the second cell, and the output of the second cell is applied to the back gate of the transistors of the first cell. A symmetrization of the two stages of the inverter circuit is therefore achieved and hence, the effects related to the variability of the method will be attenuated.

Advantageously, the complementary signals received on the complementary inputs exhibiting substantially simultaneous transitions, and on account of substantially equal propagation times in the circuit due to the arrangement of the transistors, the output signals exhibit substantially simultaneous transitions.

In the detail of the implementation of FIG. 3, the first cell 300-1 of the inverter 300, comprises a transistor 302 of nMOS type, a transistor 304 of pMOS type, an input 306 for receiving a signal of value 'A' and an output 308 for delivering a signal of inverted value '$\overline{A}$'. In the example described the transistors (302, 304) are of FDSOI type and comprise a back gate which is connected to the output 318 of the second cell. In a symmetric manner, the second cell 300-2 of the inverter 300, comprises a transistor 312 of nMOS type, a transistor 314 of pMOS type, an input 316 for receiving a signal of value '$\overline{A}$' complementary to the value 'A' of the first cell, and an output 318 for delivering a signal of inverted value 'A', which is complementary to the output value of the first cell. In a manner similar to the first cell, the transistors (312, 314) are of FDSOI type and comprise a back gate which is connected to the output 308 of the first cell. In operation, when the output 'S' of the inverter of the second cell 300-2 switches from high to low (i.e. the input has switched from low to high, from $V_{SS}$ to $V_{DD}$), it is the nMOS transistor 312 which conducts. During the same time the output 'S' of the inverter of the first cell switches from low to high, and it is the pMOS transistor 304 which conducts. In fact, advantageously by looping back the outputs of each cell onto the back gate of the transistors of the other cell, the slowest cell will slow down the fastest one and the fastest will accelerate the slowest one. Looping back the outputs therefore compensates a large part of the imbalances between the propagation times. Thus the propagation times "$tp_{HL}$" and "$tp_{LH}$" within the circuit 300 will balance (compensate one another or calibrate one another). Nonetheless, the choice of the transistors, especially their dimensioning, still makes it possible to refine the balancing of the propagation times.

Figure 4:
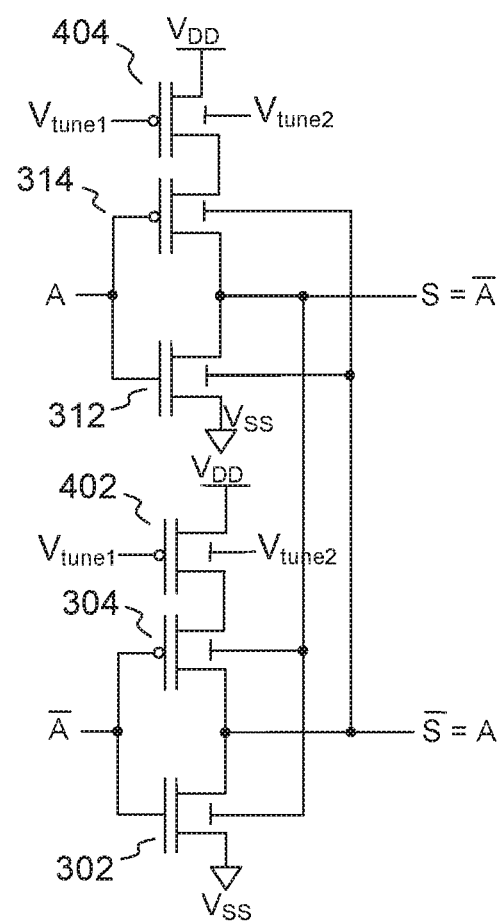
FIG. 4 shows a variant of implementation of the inverter cell of FIG. 2 in another embodiment of the invention.

The person skilled in the art understands that the transistors are connected to sources of high and low voltages ($V_{DD}$, $V_{SS}$) that need not usefully be further described, and that various implementations of the example described can be carried out depending on whether the transistors are connected directly to the supply voltage or via a current generator for example as illustrated in FIG. 4. It should be noted that the elements identical to those of FIG. 3 retain the same references, like the transistors (302, 304) and (312, 314) of each inverter cell.

FIG. 4 shows an inverter circuit in an embodiment of the invention comprising a controlled current generator in each inverter cell. The current generator is composed of a transistor (402, 404) placed between the pMOS transistor (304, 314) of each cell and the power supply $V_{DD}$ and controlled by a defined voltage '$V_{tune1}$'. In a variant implementation, a second current generator can be added through a transistor placed between the nMOS transistor (302, 312) and the low voltage $V_{SS}$.

By virtue of the back gate of the transistors mounted as current generator, it is possible for a finer adjustment or an additional calibration to bias this electrode by way of a defined voltage '$V_{tune2}$'.

Figure 5:
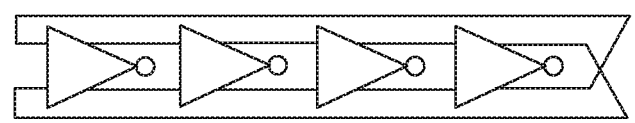
FIG. 5 shows a ring oscillator in an embodiment of the invention.

Advantageously, since the invention proposes the production of complementary logic gates, such a device makes it possible to produce a ring oscillator circuit whose duty cycle will tend to 50%, this being very significant for many applications in telecommunication. Again advantageously, the principle of the present invention makes it possible to produce voltage controlled oscillator (VCO) circuits having an even number of inverters as illustrated in FIG. 5, where the control of the VCO corresponds to the voltage '$V_{tune1}$'.

In an advantageous implementation, such an oscillator with an even number of inverters makes it possible to produce a quadrature oscillator (QVCO) exhibiting 4 outputs of like amplitude and like frequency, but with regularly distributed different phases (0°, 90°, 180° and 270°). This quadrature VCO (QVCO) topology is advantageously used in architectures of radiofrequency receivers with image frequency rejection.

In a more general manner, the principle of the invention can be extended and applied to all digital cells which use complementary logic. Moreover, the logic cells designed according to the principle of the invention are intended to be chained, combined, so as to design extended logic systems. An extended system such as this can carry out a general logic function, itself decomposable into elementary logic functions, each elementary logic function being able to be carried out by a basic logic cell.

Figure 6:
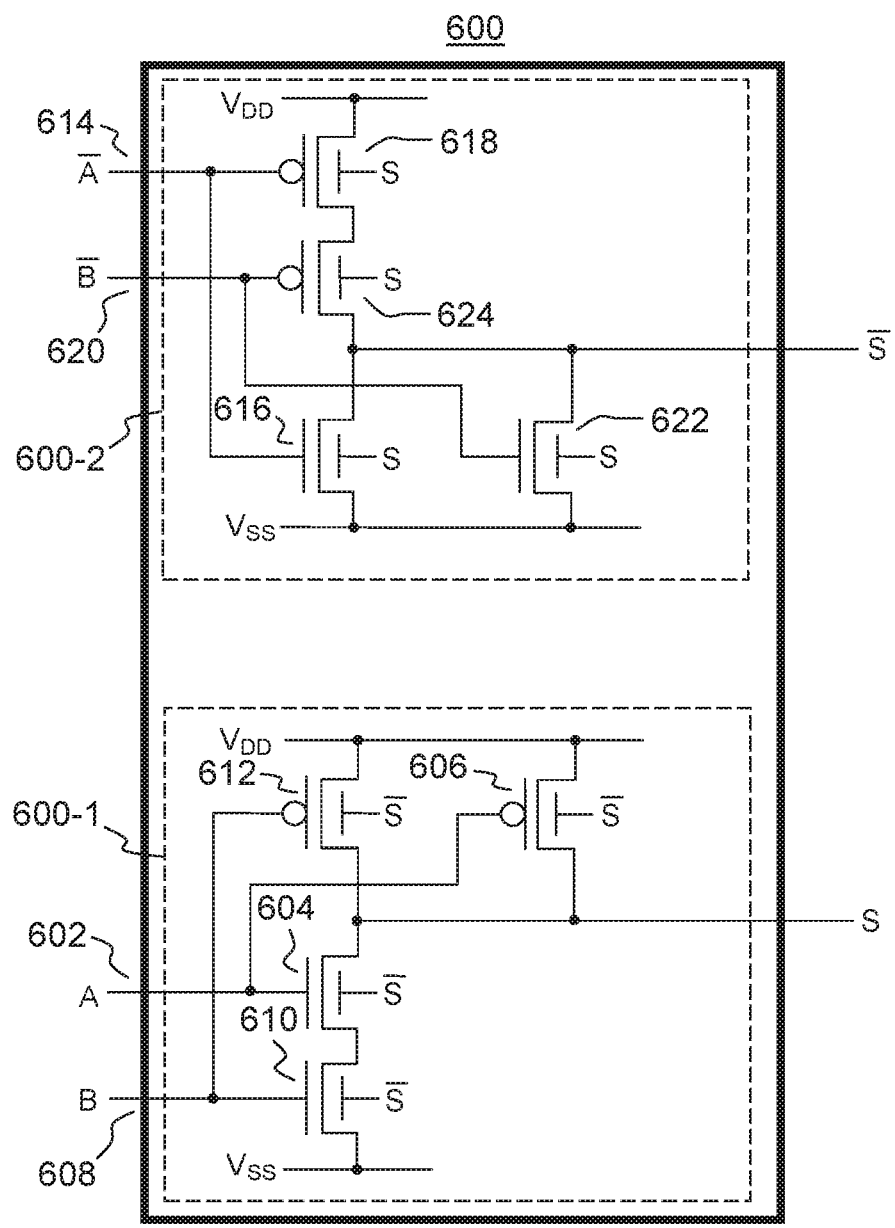
FIG. 6 shows an exemplary implementation of a NAND function with two inputs according to an embodiment of the invention.

FIG. 6 shows an exemplary implementation of a NAND function with two inputs (NAND2) according to an embodiment of the invention in FDSOI technology. The circuit 600 is composed of a first cell 600-1 and of a second complementary cell 600-2. Each cell comprises transistors making it possible to carry out a NAND function with two inputs. According to the principle of the invention, the output of each cell is looped back to the back gate of the transistors of the other cell, thus rendering the cells more robust to technological variations of the fabrication method and to randomness of operation (especially for the synthesis of asynchronous circuits).

The first NAND cell comprises a first input 602 for receiving a first signal 'A' applied to the input of two transistors nMOS 604 and pMOS 606. The first NAND cell moreover comprises a second input 608 for receiving a second signal 'B' applied to the input of two transistors nMOS 610 and pMOS 612.

The second cell 600-2 embodying the complementary NAND gate, comprises a first input 614, for receiving a first signal '$\overline{A}$' complementary to the first signal of the first cell, and applied to the input of two transistors nMOS 616 and pMOS 618. The second cell also comprises a second input 620 for receiving a second signal '$\overline{B}$' complementary to the second signal 'B' of the first cell, and applied to the input of two transistors nMOS 610 and pMOS 612.

The first NAND cell 600-1 makes it possible to deliver an output signal 'S' corresponding to the NAND function of the inputs 'A' and 'B'. The second complementary cell 600-2 makes it possible to deliver an output signal '$\overline{S}$' corresponding to the NAND function of the inputs '$\overline{A}$' and '$\overline{B}$'. The output 'S' of the first cell is applied to the back gate of all the transistors (616, 618, 622, 624) of the second cell, and the output '$\overline{S}$' of the second cell is applied to the back gate of all the transistors (604, 606, 610, 612) of the first cell. The logic output of the differential circuit NAND2 according to the principle of the invention is then:

$$\{S, \overline{S}\} = \{\overline{A,A}\} \cdot \{\overline{B,B}\} \rightarrow S = \overline{A \cdot B}(\text{NAND}) \text{ and } \overline{S} = \overline{A} \cdot \overline{B} = \overline{A+B}(\text{NOR})$$

Figure 7A:
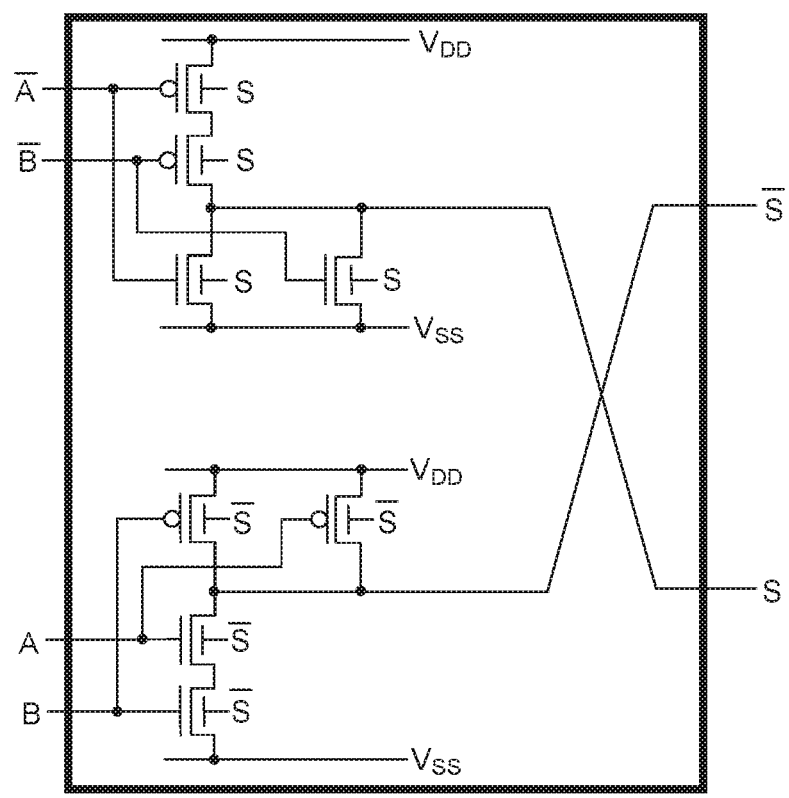
FIGS. 7a to 7e illustrate examples of implementations of logic functions according to embodiments of the invention.
Figure 7B:
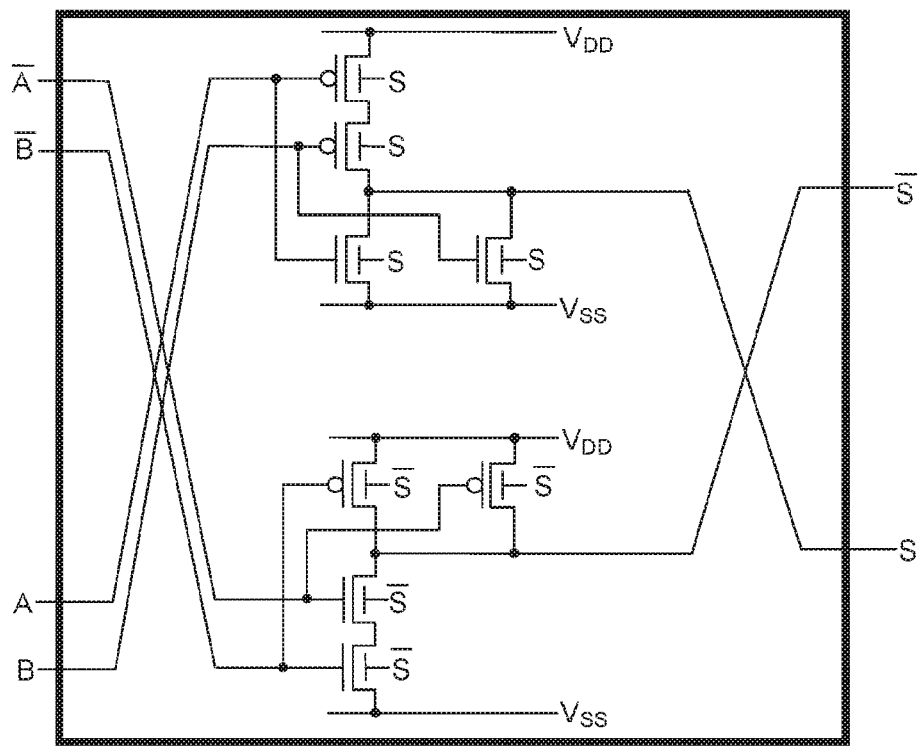
Figure 7C:
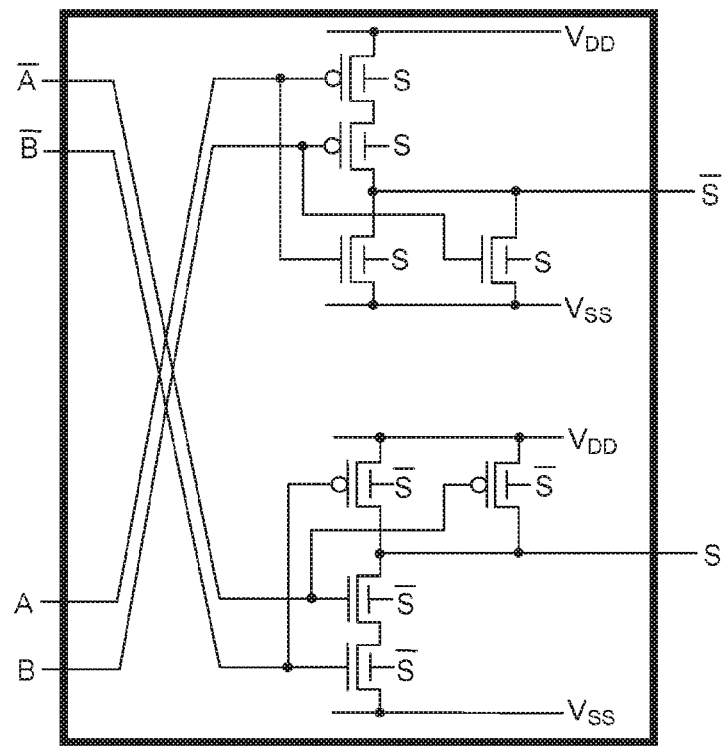
Figure 7D:
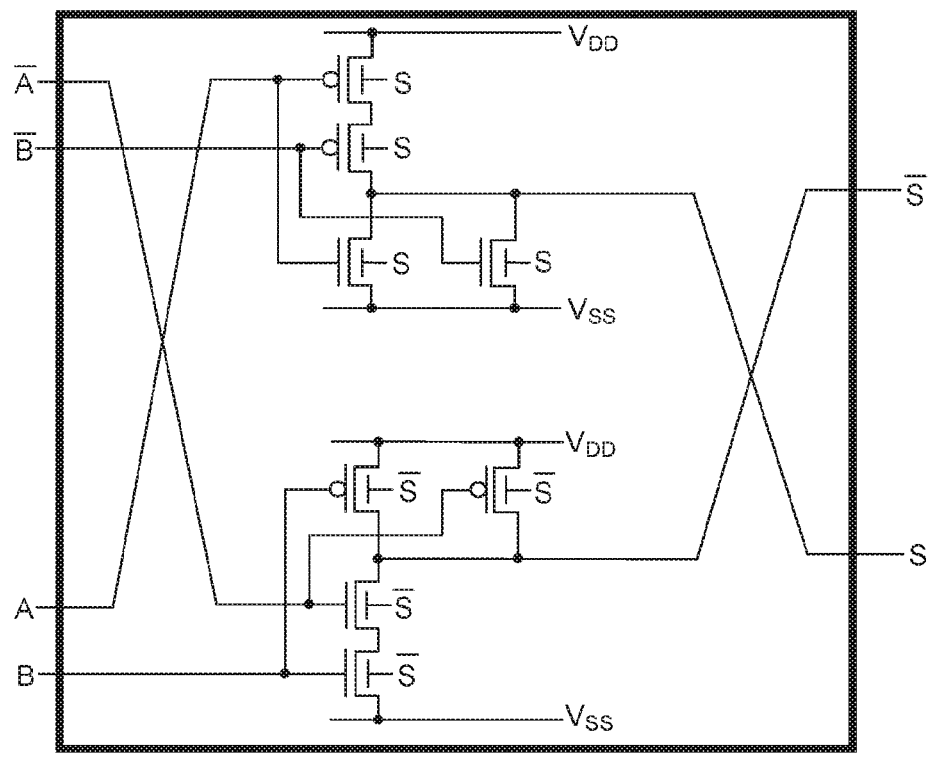
Figure 7E:
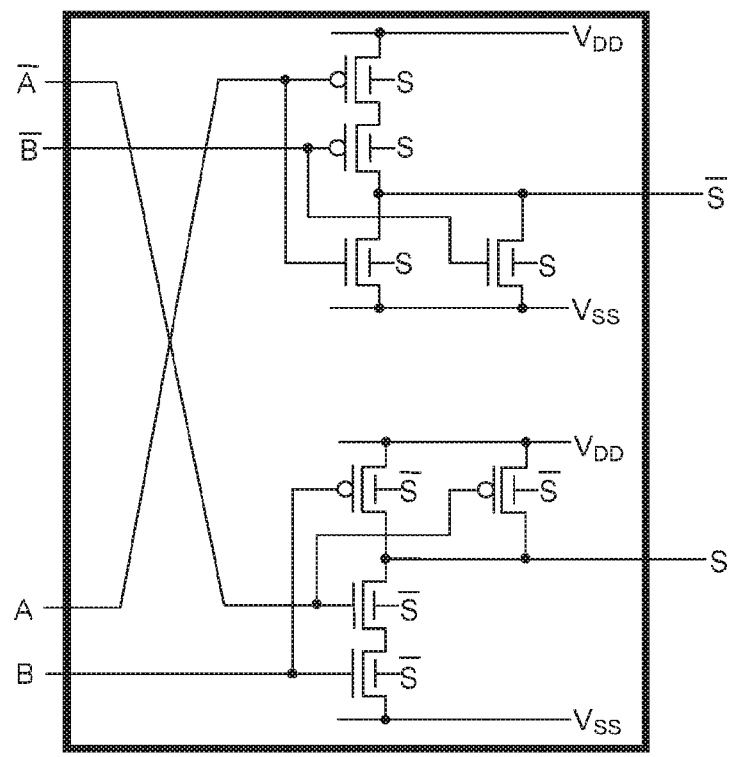

FIGS. 7a to 7e illustrate examples of implementations of complementary-logic circuits according to embodiments of the invention. FIG. 7a illustrates a differential circuit composed of two symmetric cells for carrying out an AND function with two inputs. FIG. 7b illustrates a differential circuit composed of two symmetric cells for carrying out a NOR function with two inputs. FIG. 7c illustrates a differential circuit composed of two symmetric cells for carrying out an OR function with two inputs. The cells of FIGS. 7d and 7e carry out other logic functions with two inputs.

Thus, the present description illustrates a preferential implementation of the invention, but is not limiting. A few examples have been described to allow a good understanding of the principles of the invention, and a concrete application, but they are in no way exhaustive and should allow the person skilled in the art to make modifications and variants of implementation while retaining the same principles.

The invention claimed is:

1. A differential-logic circuit able to be chained with another differential-logic circuit of a same configuration, comprising:
   a first logic cell composed of back-gate transistors, the first cell having at least one first input for receiving at least one first input signal and having an output for delivering a first output signal; and
   a second logic cell complementary to the first cell, composed of back-gate transistors, the second cell having as many inputs as the first cell, each input being configured to receive an input signal complementary to a respective input signal of the first cell, the second cell having an output for delivering a second output signal complementary to the first output signal of the first cell;
   wherein the said first output signal of the first cell is applied to a back gate of each transistor of the second cell and being able to be a first input of said another chained differential-logic circuit of the same configuration, and
   wherein the said second output signal of the second cell is applied to the back gate of each transistor of the first cell and being able to be a second input of said another chained differential-logic circuit of the same configuration.

2. The circuit according to claim 1, wherein the transistors are transistors with asymmetric back gate.

3. The circuit according to claim 2, wherein the transistors are of CMOS type.

4. The circuit according to claim 1, wherein the first cell is a first CMOS inverter able to deliver an output inverse to its input, and the second cell is a second CMOS inverter able to receive an input complementary to the input of the first inverter and to deliver an output complementary to the output of the first inverter, the output of the first inverter being applied to the back gate of the nMOS and pMOS transistors of the second CMOS inverter and the complementary output of the second inverter being applied to the back gate of the nMOS and pMOS transistors of the first CMOS inverter.

5. The circuit according to claim 4, wherein the first inverter and the second inverter are connected directly between a high voltage and a low voltage.

6. The circuit according to claim 4, wherein the first inverter and the second inverter comprise a current generator between the pMOS transistor and a high voltage.

7. The circuit according to claim 5, wherein the first inverter and the second inverter comprise a current generator between the nMOS transistor and a low voltage.

8. A system comprising several circuits according to claim 1, the said several circuits being coupled as a chain so that the outputs of a circuit of the chain are connected to the inputs of the following circuit in the chain.

9. The system according to claim 8, wherein the input signals exhibit substantially simultaneous transitions, the propagation times are substantially equal and the output signals exhibit substantially simultaneous transitions.

10. The system according to claim 8, comprising an even number of circuits, the system producing a voltage controlled oscillator.

11. An oscillator according to claim 10, comprising four identical outputs of the same amplitude, of the same frequency and of regularly distributed phases.

12. The circuit according to claim 1, wherein the first cell comprises CMOS transistors able to carry out an AND function of two inputs and the second cell comprises CMOS transistors able to carry out an AND function of the two complementary inputs of the first cell.

13. The circuit according to claim 1, wherein the first cell comprises CMOS transistors able to carry out a NAND function of two inputs and the second cell comprises CMOS transistors able to carry out a NAND function of the two complementary inputs of the first cell.

14. The circuit according to claim 1, wherein the first cell comprises CMOS transistors able to carry out an OR function of two inputs and the second cell comprises CMOS transistors able to carry out an OR function of the two complementary inputs of the first cell.

15. The circuit according to claim 1, wherein the first cell comprises CMOS transistors able to carry out a NOR function of two inputs and the second cell comprises CMOS transistors able to carry out a NOR function of the two complementary inputs of the first cell.

16. The circuit according to claim 12, wherein the transistors are transistors based on fully depleted silicon on insulator "FDSOI" technology.

17. The circuit according to claim 12, wherein the transistors are double-gate "FinFet" transistors.

* * * * *